(12) United States Patent
Lee et al.

(10) Patent No.: US 11,621,309 B2
(45) Date of Patent: Apr. 4, 2023

(54) LIGHT EMITTING DEVICE AND DISPLAY APPARATUS INCLUDING THE SAME

(71) Applicants: SAMSUNG ELECTRONICS CO., LTD., Suwon-si (KR); IUCF-HYU (INDUSTRY-UNIVERSITY COOPERATION FOUNDATION HANYANG UNIVERSITY, Seoul (KR)

(72) Inventors: Sunghoon Lee, Seoul (KR); Seokho Song, Seoul (KR); Wonjae Joo, Seongnam-si (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 29 days.

(21) Appl. No.: 17/135,546

(22) Filed: Dec. 28, 2020

(65) Prior Publication Data

US 2022/0020828 A1 Jan. 20, 2022

(30) Foreign Application Priority Data

Jul. 17, 2020 (KR) .................. 10-2020-0089167

(51) Int. Cl.
| | | |
|---|---|---|
| H01L 33/00 | (2010.01) | |
| H01L 21/00 | (2006.01) | |
| H01L 27/32 | (2006.01) | |
| G02B 27/01 | (2006.01) | |
| H01L 51/52 | (2006.01) | |

(52) U.S. Cl.
CPC ...... *H01L 27/3232* (2013.01); *G02B 27/0172* (2013.01); *H01L 51/5265* (2013.01); *G02B 2027/0178* (2013.01)

(58) Field of Classification Search
CPC .................................................... H01L 27/3232
USPC .......................... 438/29–31, 69; 257/98–99
See application file for complete search history.

(56) References Cited

U.S. PATENT DOCUMENTS

| | | |
|---|---|---|
| 6,861,800 B2 | 3/2005 | Tyan et al. |
| 6,917,159 B2 | 7/2005 | Tyan et al. |
| 6,936,960 B2 | 8/2005 | Cok |
| 7,023,013 B2 | 4/2006 | Ricks et al. |
| 8,080,938 B2 * | 12/2011 | Hwang ............... H01L 27/3206 313/506 |

(Continued)

OTHER PUBLICATIONS

Sunkook Kim et al., "Low-Power Flexible Organic Light-Emitting Diode Display Device", Advanced Materials, 2011, vol. 23, pp. 3511-3516. (8 pages total).

(Continued)

*Primary Examiner* — Calvin Lee
(74) *Attorney, Agent, or Firm* — Sughrue Mion, PLLC

(57) ABSTRACT

A light emitting device includes a metal reflective layer including a phase modulation surface on which oblong phase modulation elements are formed; a first electrode provided on the metal reflective layer; an organic emission layer that is provided on the first electrode and that emits light; and a second electrode provided on the organic emission layer, wherein the oblong phase modulation elements are arranged to form a geometric phase lens.

20 Claims, 11 Drawing Sheets

(56) References Cited

U.S. PATENT DOCUMENTS

| | | | |
|---|---|---|---|
| 8,304,788 B2 * | 11/2012 | Fukuda | H01L 51/5271 257/89 |
| 8,614,698 B2 * | 12/2013 | Desieres | H01L 51/5206 345/204 |
| 8,692,237 B2 * | 4/2014 | Kim | H01L 51/5203 257/40 |
| 9,425,245 B2 | 8/2016 | Song et al. | |
| 9,437,841 B2 | 9/2016 | Zhou et al. | |
| 10,079,358 B2 | 9/2018 | Song et al. | |
| 10,120,193 B2 | 11/2018 | Lam | |
| 10,466,496 B2 | 11/2019 | Parsons | |
| 10,615,372 B2 * | 4/2020 | Joo | H01L 27/322 |
| 11,038,148 B2 * | 6/2021 | Kyoung | H01L 51/5265 |
| 2005/0280362 A1 | 12/2005 | Shore et al. | |
| 2012/0025185 A1 | 2/2012 | Kasamatsu | |
| 2019/0041669 A1 | 2/2019 | Jiang et al. | |
| 2019/0198817 A1 | 6/2019 | Joo et al. | |
| 2020/0227685 A1 | 7/2020 | Kyoung et al. | |
| 2020/0403037 A1 | 12/2020 | Joo et al. | |
| 2021/0018773 A1 * | 1/2021 | Woodgate | H04N 13/315 |
| 2021/0151716 A1 | 5/2021 | Kyoung et al. | |
| 2021/0159460 A1 | 5/2021 | Joo et al. | |
| 2021/0280832 A1 | 9/2021 | Koo et al. | |
| 2021/0288290 A1 | 9/2021 | Lee et al. | |
| 2021/0296616 A1 | 9/2021 | Song et al. | |
| 2022/0020949 A1 | 1/2022 | Bae et al. | |
| 2022/0020963 A1 | 1/2022 | Lee et al. | |
| 2022/0037613 A1 | 2/2022 | Song et al. | |
| 2022/0271259 A1 | 8/2022 | Song et al. | |

OTHER PUBLICATIONS

Liang-Sun Hung et al., "Reduction of Ambient Light Reflection in Organic Light-Emitting Diodes", Advanced Materials, Dec. 3, 2001, vol. 13, No. 23, pp. 1787-1790. (4 pages total).

* cited by examiner

LIGHT EMITTING DEVICE AND DISPLAY APPARATUS INCLUDING THE SAME

CROSS-REFERENCE TO RELATED APPLICATION

This application is based on and claims priority under 35 U.S.C. § 119 to Korean Patent Application No. 10-2020-0089167, filed on Jul. 17, 2020, in the Korean Intellectual Property Office, the disclosure of which is incorporated by reference herein in its entirety.

BACKGROUND

1. Field

The disclosure relates to a light emitting device and a display apparatus including the same.

2. Description of Related Art

An organic light emitting device (OLED) emits light of a certain color by combination of holes supplied from an anode and electrons supplied from a cathode in an organic emission layer. A display apparatus using such an OLED may exhibit excellent display characteristics such as a wide viewing angle, a fast response speed, a small thickness, and a high contrast. Such an OLED may be applied to various devices such as display apparatuses for implementing augmented reality or virtual reality.

SUMMARY

Provided are a light emitting device that generates specific polarized light and a display apparatus including the same.

Additional aspects will be set forth in part in the description which follows and, in part, will be apparent from the description, or may be learned by practice of embodiments of the disclosure.

In accordance with an aspect of the disclosure, a light emitting device includes a metal reflective layer including a phase modulation surface on which oblong phase modulation elements are formed; a first electrode provided on the metal reflective layer; an organic emission layer provided on the first electrode, the organic emission layer emitting light; and a second electrode provided on the organic emission layer, wherein the oblong phase modulation elements are arranged to form a geometric phase lens.

Light having a predetermined polarization may be reflected, focused, and output by the arrangement of the oblong phase modulation elements.

The light may have one of a left circular polarization and a right circular polarization.

The phase modulation surface of the metal reflective layer may include a plurality of protrusions constituting the oblong phase modulation elements.

The phase modulation surface of the metal reflective layer may further include a plurality of recesses.

Each of the plurality of protrusions may resonate light of a first wavelength, and the plurality of recesses may absorb light of a second wavelength different from the first wavelength.

The light of the first wavelength may include red light or green light.

The light of the second wavelength may include blue light.

Each of the plurality of protrusions may resonate blue light.

The organic emission layer may emit white light.

In accordance with an aspect of the disclosure, a display apparatus may include a plurality of pixels including a first pixel emitting light of a first color and a second pixel emitting light of a second color; a metal reflective layer including a phase modulation surface on which oblong phase modulation elements are formed; a first electrode provided on the metal reflective layer; an organic emission layer provided on the first electrode, the organic emission layer emitting white light; and a second electrode provided on the organic emission layer, wherein the oblong phase modulation elements are arranged to form a geometric phase lens.

Light having a predetermined polarization may be reflected, focused, and output by the arrangement of the oblong phase modulation elements.

The light may have one of a left circular and a right circular polarization.

The phase modulation surface of the metal reflective layer may include a plurality of protrusions constituting the oblong phase modulation elements.

The phase modulation surface of the metal reflective layer may further include a plurality of recesses.

Each of the plurality of protrusions may resonate light of a first wavelength, and the plurality of recesses may absorb light of a second wavelength different from the first wavelength.

The light of the first wavelength may include red light or green light.

The light of the second wavelength may include blue light.

Each of the plurality of protrusions may resonate blue light.

The plurality of pixels may include blue pixels, green pixels, and red pixels, wherein a first area corresponding to the red pixels of the metal reflective layer includes a first portion of the plurality of protrusions, wherein a second area corresponding to the green pixels of the metal reflective layer includes a second portion of the plurality of protrusions, and wherein a third area of the metal reflective layer corresponding to the blue pixels of the metal reflective layer includes the plurality of recesses.

In accordance with an aspect of an embodiment, a metal reflective layer includes a surface; a plurality of protrusions protruding from the surface that resonate a first range of wavelengths of incident light; and a plurality recesses recessed from the surface that absorb a second range of wavelengths of the incident light, the second range being different from the first range.

Each recess of the plurality of recesses may be positioned between respective adjacent protrusions of the plurality of protrusions.

The plurality of protrusions may include a first group of protrusions that resonate a first wavelength of the incident light and a second group of protrusions that resonate a second wavelength of the incident light.

The metal reflective layer may further include a first region including the first group of protrusions and a first group of recesses of the plurality of recesses; a second region including the second group of protrusions and a second group of recesses of the plurality of recesses; and a third region including a third group of protrusions of the plurality of protrusions that resonate a third wavelength of the incident light, the third wavelength being included in the second range of wavelengths.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
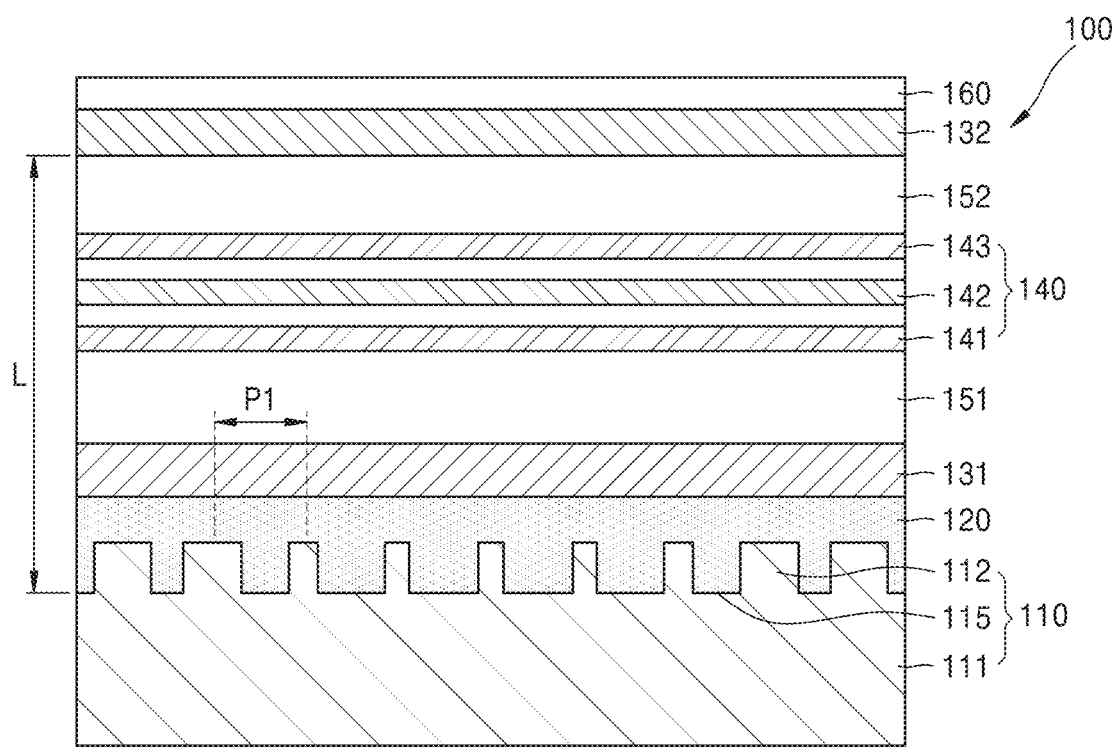
FIG. 1 is a cross-sectional view of a light emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The same reference numerals refer to the same elements throughout. In the drawings, the sizes of constituent elements may be exaggerated for clarity. Embodiments described below are only examples, and thus, it should be understood that embodiments may be modified in various forms.

For example, when an element is referred to as being "on" or "above" another element, it may be directly on the other element, or intervening elements may also be present. It will be understood that, although the terms "first," "second," etc. may be used herein to describe various elements, these elements should not be limited by these terms. These terms are used only to differentiate an element from another element. These terms do not limit the material or structure of the components. As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added. The use of the terms "a," "an," and "the" and similar referents is to be construed to cover both the singular and the plural.

FIG. 1 is a cross-sectional view of a light emitting device 100 according to an embodiment.

Referring to FIG. 1, the light emitting device 100 according to an embodiment includes a metal reflective layer 110 including a phase modulation surface 115 (i.e., a surface), a first electrode 131 provided on the metal reflective layer 110, an organic emission layer 140 provided on the first electrode 131, and a second electrode 132 provided on the organic emission layer 140. Oblong phase modulation elements 112 may be formed on the phase modulation surface 115 of the metal reflective layer 110, and the oblong phase modulation elements may be arranged to form a geometric phase lens (GPL). That is, in the light emitting device 100 according to an embodiment, the metal reflective layer 110 including the phase modulation surface 115 on which the oblong phase modulation elements 112 are formed may be formed to function as a reflective GPL mirror. As described above, by forming oblong phase modulation elements 112 on the phase modulation surface of the metal reflective layer 110 to have an arrangement for forming a GPL, the light emitting element 100 may reflect and focus certain polarized light (i.e., light having a predetermined polarization) and output the same.

A dielectric layer 120 may be between the metal reflective layer 110 and the first electrode 131 to cover the phase modulation surface 115 of the metal reflective layer 110. The dielectric layer 120 may protect the phase modulation surface 115 of the metal reflective layer 110 and may planarize an upper portion of the phase modulation surface 115 for a uniform current density. To this end, the dielectric layer 120 may be provided to cover the phase modulation surface 115 of the metal reflective layer 110 so that an upper surface thereof is flat. The dielectric layer 120 may include an insulating material transparent to visible light. The dielectric layer 120 may include, for example, $SiO_2$, SiNx, $Al_2O_3$, $HfO_2$, etc., but is not limited thereto.

The organic emission layer 140 may be provided to emit white light. For example, the organic emission layer 140 may have a structure in which a red organic emission layer 141, a green organic emission layer 142, and a blue organic emission layer 143 are sequentially stacked between the first electrode 131 and the second electrode 132. The stacking order of the red organic emission layer 141, the green organic emission layer 142, and the blue organic emission layer 143 may be changed. For example, an exciton blocking layer may be provided between the red organic emission layer 141 and the green organic emission layer 142 and/or between the green organic emission layer 142 and the blue organic emission layer 143.

The first electrode 131 may serve as an anode that provides holes to the organic emission layer 140, and the second electrode 132 may serve as a cathode that provides electrons to the organic emission layer 140. To this end, the first electrode 131 may include a material having a relatively high work function, and the second electrode 132 may include a material having a relatively low work function.

The first electrode 131 may be a transparent electrode that transmits light. For example, the first electrode 131 may include a transparent conductive oxide such as indium tin oxide (ITO), indium zinc oxide (IZO), and aluminum zinc oxide (AZO).

The second electrode 132 may be a transflective electrode that reflects a portion of light and transmits another portion of light. The second electrode 132 may include a thin metal layer. For example, the second electrode 132 may be a mixed layer of silver (Ag) and magnesium (Mg) or a mixed layer of aluminum (Al) and lithium (Li). The thickness of the second electrode 132 may be about 10 nm to about 20 nm. Since the thickness of the second electrode 132 is thin, a portion of light may pass through the second electrode 132. A passivation layer 160 may be formed on the surface of the second electrode 132 as shown in FIG. 1.

A hole injection layer 151 may be provided between the first electrode 131 and the organic emission layer 140. Further, a hole transfer layer may be further provided between the hole injection layer 151 and the organic emission layer 140. An electron injection layer 152 may be provided between the second electrode 132 and the organic emission layer 140. Further, an electron transfer layer may be further provided between the electron injection layer 152 and the organic emission layer 140.

Meanwhile, various additional layers may be further provided as needed. For example, an electron blocking layer may be further provided between the hole transfer layer and the organic emission layer 140, and a hole blocking layer may be further provided between the electron transfer layer and the organic emission layer 140.

Holes provided by the hole injection layer 151 from the first electrode 131 and electrons provided by the electron injection layer 152 from the second electrode 132 are combined in the red, green, and blue organic emission layers 141, 142, and 143 to generate red light, green light, and blue light, respectively.

The metal reflective layer 110 constitutes a micro-cavity L together with the second electrode 132. Accordingly, the micro-cavity L may be formed between the metal reflective layer 110 and the second electrode 132. For example, after light generated from the organic emission layer 140 reciprocates and resonates between the metal reflective layer 110 and the second electrode 132, light corresponding to a resonance wavelength of the micro-cavity L may be emitted to the outside through the second electrode 132.

The resonance wavelength of the micro-cavity L may be determined by an optical length of the micro-cavity L. For example, when the resonance wavelength of the micro-cavity L is $\lambda$, the optical length of the micro-cavity L may be $n\lambda/2$ (n is a natural number). The optical length of the micro-cavity L may be determined by the sum of an optical thickness of layers forming the micro-cavity L between the metal reflective layer 110 and the second electrode 132, a phase delay due to the second electrode 132, and a phase shift (e.g., a phase delay) caused by the metal reflective layer 110. The optical thickness of the layers forming the micro-cavity L is not a simple physical thickness, but a thickness considering a refractive index of the layers.

The optical length of the micro-cavity L or the resonance wavelength of the micro-cavity L may be adjusted by controlling the phase shift by the metal reflective layer 110 while fixing the optical thickness of the layers forming the micro-cavity L and the phase delay caused by the second electrode 132. As another example, the optical length of the micro-cavity L or the resonance wavelength of the micro-cavity L may be adjusted by adjusting the optical thickness of the layers forming the micro-cavity L and the phase shift by the metal reflective layer 110.

Meanwhile, according to an embodiment, a phase modulation surface 115 may be formed on the metal reflective layer 110 so as to form a GPL by controlling the phase shift caused by the metal reflective layer 110. Oblong phase modulation elements 112 may be formed on the phase modulation surface of the metal reflective layer 110, and the oblong phase modulation elements 112 may be arranged to form a GPL.

In this way, by arranging oblong phase modulation elements 112 on the phase modulation surface 115 of the metal reflective layer 110 to form a GPL, in the light emitting device 100 according to an embodiment, the metal reflective layer 110 may be formed to act as a reflective GPL mirror. When, for example, right circularly polarized light is incident on the GPL, the GPL may convert and focus the incident polarized light into left circularly polarized light. In addition, when, for example, left circularly polarized light is incident on the GPL, the GPL may convert and focus the incident polarized light into right circularly polarized light.

Accordingly, by forming oblong phase modulation elements 112 on the phase modulation surface 115 of the metal reflective layer 110 to have an arrangement for forming a GPL, light reflected, focused, and output from the light emitting element 100 may have a certain polarization. In this case, the certain polarization may be one circular polarization, for example, left circular polarization or right circular polarization. For example, according to the light emitting device 100 according to an embodiment, focused left circularly polarized light may be output.

Figure 2:
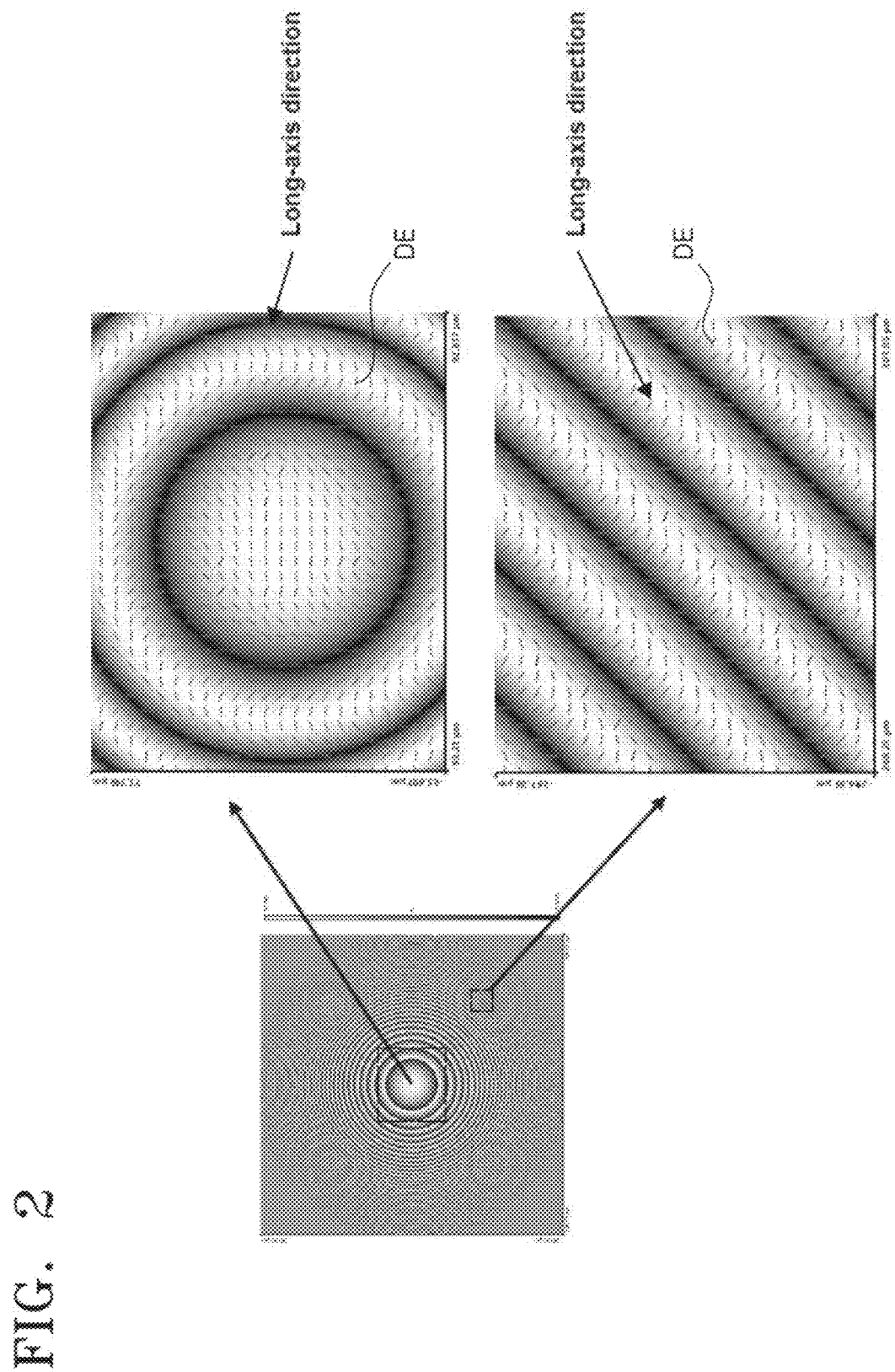
FIG. 2 is a plan view schematically showing a phase modulation surface of a metal reflective layer of FIG. 1 according to an embodiment.

FIG. 2 is a plan view schematically showing a phase modulation surface 115 of the metal reflective layer 110 of FIG. 1. The left portion of FIG. 2 shows the overall phase modulation surface 115 of the metal reflective layer 110, the upper right portion of FIG. 2 is an enlarged view of a center portion of the phase modulation surface 115 of the metal reflective layer 110, and the lower right portion of FIG. 2 is an enlarged view of an outer portion of the phase modulation surface of the metal reflective layer 110.

As shown in FIG. 2, phase modulation elements may be arranged on the phase modulation surface 115 of the metal reflective layer 110 to form a GPL. In this case, the phase modulation elements may have an oblong shape.

Figure 3:
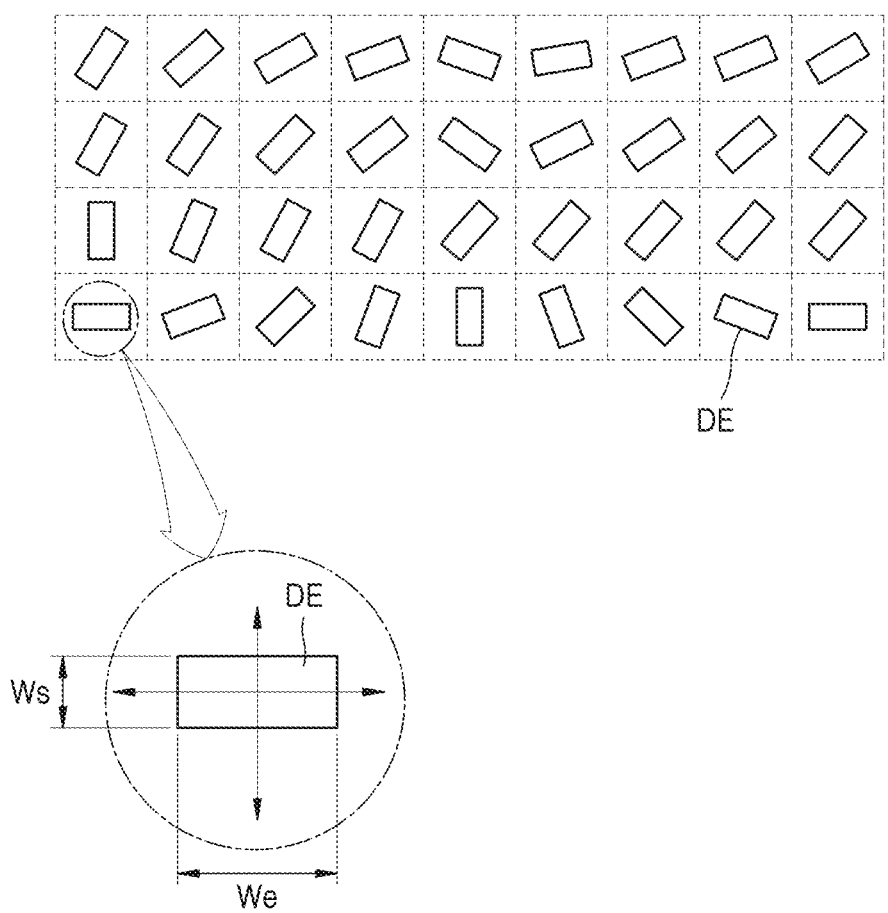
FIG. 3 is a plan view schematically showing a phase modulation surface of a metal reflective layer of FIG. 1, illustrating a partial area of the metal reflective layer according to an embodiment.

FIG. 3 is a plan view schematically showing the metal reflective layer 110 of FIG. 1, illustrating a partial area of the metal reflective layer 110.

Referring to FIG. 3, on a phase modulation surface 115 of the metal reflective layer 110, oblong phase modulation elements DE are arranged at various angles with respect to, for example, a horizontal or vertical direction on the plane of the phase modulation surface 115 to form a GPL. However, intervals (P1 in FIG. 1) between the phase modulation elements may be constant. Dashed lines dividing the partition in FIG. 3 are virtual lines to show that the phase modulation elements form various angles with respect to the horizontal or vertical direction, but are arranged at the constant interval P1.

In the light emitting device 100 according to an embodiment, when the width in a long-axis direction is We and the width in a short-axis direction is Ws, the oblong phase modulation elements DE satisfy the condition of We≠Ws. Accordingly, the oblong phase modulation elements DE arranged on the phase modulation surface 115 of the metal reflective layer 110 modulate the phase of light by acting as an anisotropic medium, and the metal reflective layer 110 may function as a reflective GPL mirror by arranging the oblong phase modulation elements DE on the phase modulation surface 115 of the metal reflective layer 110 to serve as a GPL. Accordingly, light reflected by the metal reflective layer 110 may be focused light having one circular polarization, for example, left circular polarization, and thus, focused light having one circular polarization may be output from the light emitting device 100.

Figure 4:
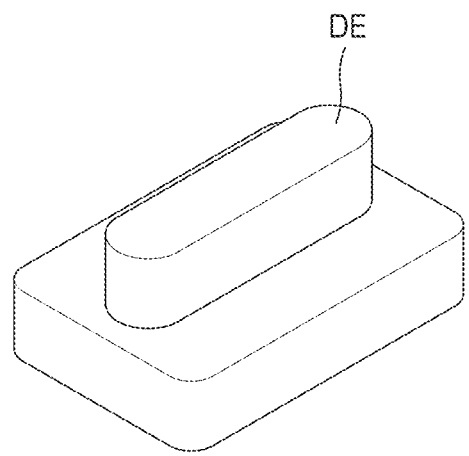
FIG. 4 is a view illustrating a case where an oblong phase modulation element forms a protrusion according to an embodiment.
Figure 5:
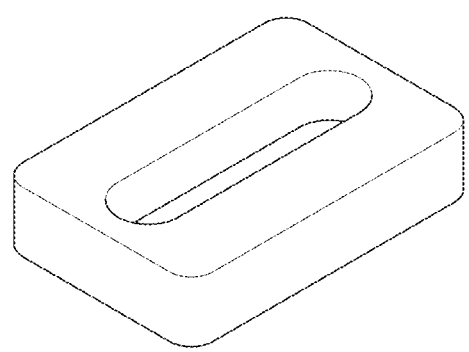
FIG. 5 is a view illustrating a case where an oblong phase modulation element forms a recess according to an embodiment.

FIGS. 4 and 5 are perspective views showing examples of the oblong phase modulation element DE formed on a phase modulation surface 115 of the metal reflective layer 110 of the light emitting device 100 according to an embodiment. FIG. 4 shows an example case where the oblong phase modulation element DE forms a protrusion. FIG. 5 shows an example case where the oblong phase modulation element DE forms a recess.

In this way, the oblong phase modulation element DE formed on the phase modulation surface 115 of the metal reflective layer 110 of the light emitting device 100 according to an embodiment may be formed as a protrusion or a recess.

FIG. 1 shows an embodiment in which an oblong phase modulation element 112 is formed as a protrusion.

For example, as shown in FIG. 1, the phase modulation surface 115 of the metal reflective layer 110 may include a plurality of protrusions, each forming an oblong phase modulation element.

That is, the metal reflective layer 110 may include a base portion 111 and a phase modulation surface 115 formed on an upper surface of the base portion 111, and the phase modulation surface 115 may include a plurality of protrusions 112. FIG. 1 shows that the base portion 111 and the plurality of protrusions 112 are formed to be located at different heights as one layer. However, the base portion 111 and the plurality of protrusions 112 may be located on different layers. The metal reflective layer 110 may include, for example, at least one metal material from among Ag, Al, and Au. However, this is merely an example, and embodiments are not limited thereto.

At this time, the plurality of protrusions are arranged at various angles with respect to the horizontal or vertical direction on the plane of the phase modulation surface, like the arrangement of the oblong phase modulation elements illustrated in FIG. 3, but the intervals P1 of the protrusions may be constant. FIG. 1 shows that widths of the plurality of protrusions are variable. The interval of the plurality of protrusions may be constant, and because the plurality of protrusions form various angles with respect to the horizontal direction, it is seen that the widths are variable in the cross-sectional view of FIG. 1.

In this way, the plurality of protrusions may be formed, for example, in a meta structure to form a nano-pattern having a size less than a wavelength of visible light, and an arrangement of a plurality of protrusions forming an oblong phase modulation element in a long-axis direction may be formed to have an arrangement forming a GPL.

Meanwhile, as shown in FIG. 1, when the phase modulation surface 115 of the metal reflective layer 110 includes a plurality of protrusions each forming an oblong phase modulation element, the plurality of protrusions may contribute to the resonating of light of a desired wavelength. That is, a phase shift due to the metal reflective layer 110 contributing to the micro-cavity L may vary according to heights and widths of the plurality of protrusions.

Each of the plurality of protrusions 112 constitutes, for example, an oblong phase modulation element, and at least one of a width in a long-axis direction and a width in a short-axis direction may be about 300 nm or less. However, the disclosure is not limited thereto. For example, each of the plurality of protrusions 112 may have at least one of a width in the long-axis direction and a width in the short-axis direction of about 30 nm to about 250 nm. In addition, each of the plurality of protrusions 112, for example, may have a height of about 100 nm or less. However, this is merely an example.

Optical characteristics (e.g., a phase delay of reflected light) of a phase modulation surface 115 that contribute to a resonance wavelength may be determined by the size, the ratio of the width in the long-axis direction and the width in the short-axis direction, and the height of each of the plurality of protrusions 112 and an interval P1 of the protrusions 112. Therefore, when the resonance wavelength of the micro-cavity L is λ, the size and height of each of the protrusions 112 of the phase modulation surface 115 and the pitch P1 of the protrusions 112 may be selected such that an optical length of the micro-cavity L satisfies nλ/2 (n is a natural number). The light-emitting device 100 illustrated in FIG. 1 may be, for example, a red light-emitting device in which the micro-cavity L is adjusted to have a wavelength of red light as the resonance wavelength. In addition, the light-emitting device 100 illustrated in FIG. 1 may be a green light-emitting device in which the micro-cavity L is adjusted to have a wavelength of green light as a resonance wavelength. In addition, the light-emitting device 100 illustrated in FIG. 1 may be a blue light-emitting device in which the micro-cavity L is adjusted to have a wavelength of blue light as a resonance wavelength.

According to the light emitting device 100 according to an embodiment, because the metal reflective layer 110 is formed such that an arrangement of the plurality of protrusions forming an oblong phase modulation element in a long-axis direction has an arrangement forming a GPL and serves as a GPL mirror, in a cavity formed by the GPL mirror (the metal reflective layer 110) and an output mirror (the second electrode 132), specific circularly polarized light amplified through resonance is output through the output mirror (the second electrode 132).

Figure 6:
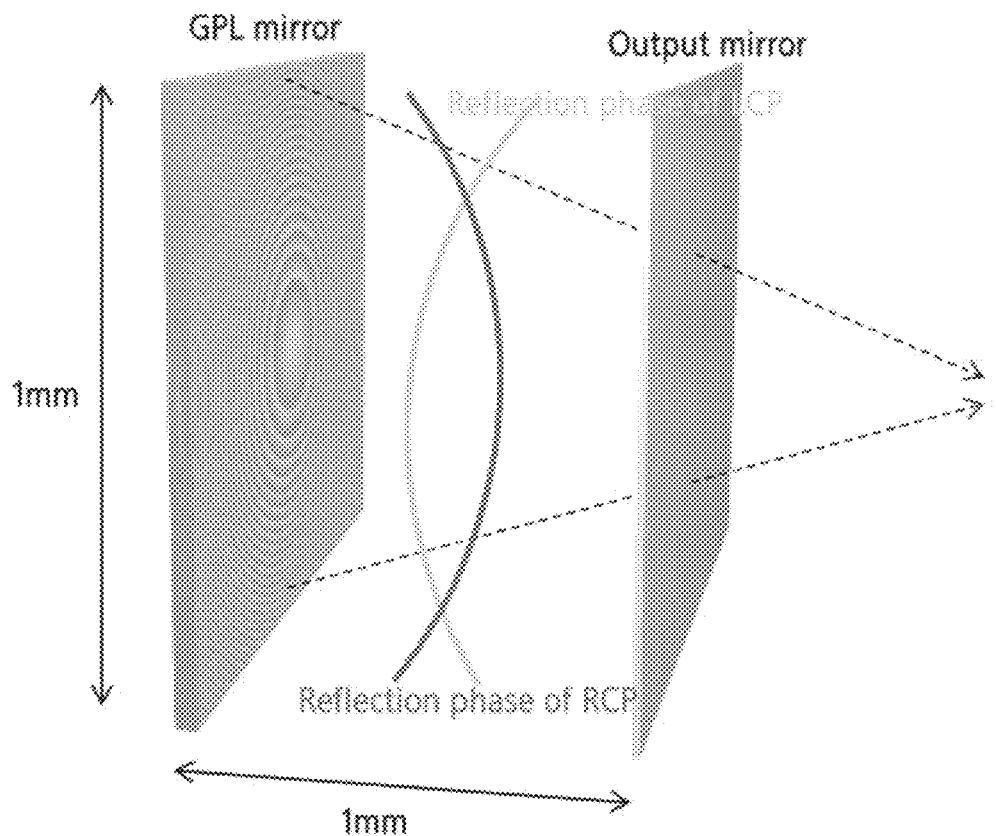
FIG. 6 and FIGS. 7A and 7B are views illustrating simulation results with regard to a light emitting device according to an embodiment in which a geometric phase lens mirror is applied as a metal reflective layer according to an embodiment.
Figure 7A:
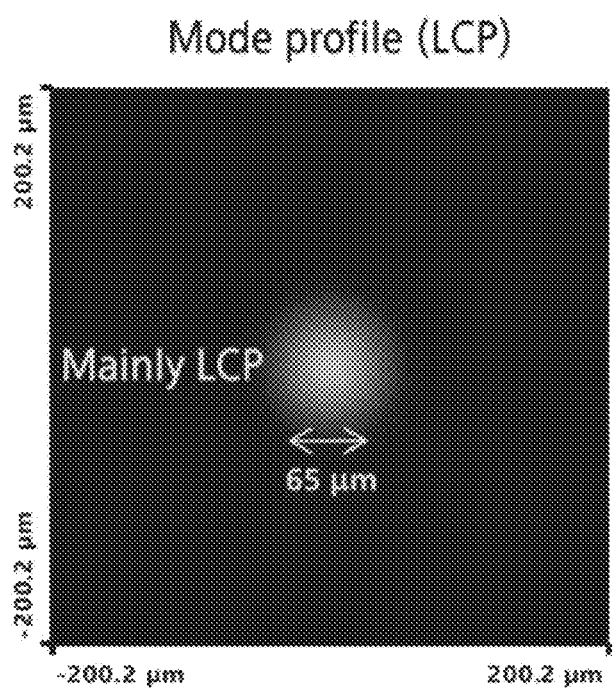
Figure 7B:
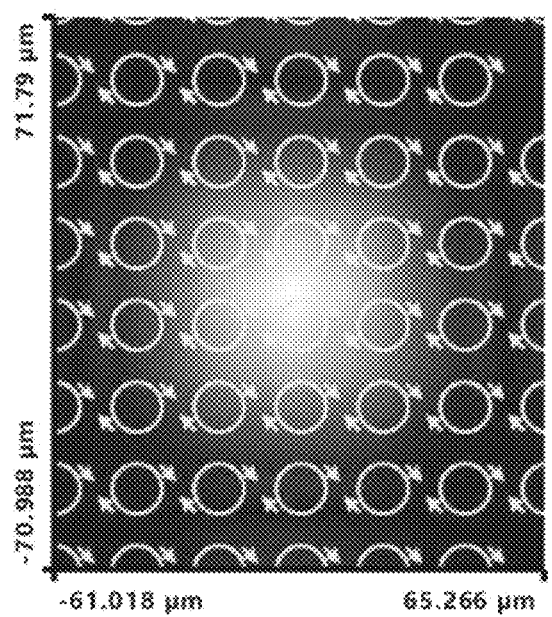

FIG. 6 and FIGS. 7A and 7B are views illustrating simulation results of a light emitting device according to an embodiment in which a GPL mirror is applied as a metal reflective layer. FIG. 6 shows the phase of reflected light according to a polarization component between the GPL mirror and an output mirror (a second electrode), FIG. 7A shows a beam mode profile output from the light emitting device, and FIG. 7B shows a polarization direction in a beam mode.

As can be seen in FIG. 6, when the GPL mirror is applied as a metal reflective layer, specific polarized light amplified through resonance in a cavity formed by the GPL mirror (the metal reflective layer) and the output mirror (a transflective second electrode) is emitted through the output mirror. At this time, light reflected by the output mirror and proceeding to the GPL mirror (the metal reflective layer) may have a reflection phase of a divergence mode of one circular polarization component, for example, a right circular polarization (RCP) component, and light reflected by the GPL mirror (the metal reflective layer) and proceeding to the output mirror may have a reflection phase of a convergence mode of another circular polarization component, for example, a left circular polarization (LCP) component. Light resonated in a cavity formed by the GPL mirror (the metal reflective layer) and the output mirror (the second electrode) may be emitted through the output mirror as output light having the other circularly polarized light, for example, left circularly polarized light (LCP) as shown in FIGS. 7A and 7B. In this case, the output light may have a focusing mode profile as shown in FIGS. 7A and 7B, and output focused light has the other circular polarization, for example, the left circular polarization (LCP).

Accordingly, because focused light amplified through resonance from the light-emitting device according to an embodiment and having the other circularly polarized light, for example, the left circularly polarized light (LCP) is output, when the light emitting device according to an embodiment is applied to a glasses-type display apparatus for realizing augmented reality or virtual reality, coupling efficiency in a combiner or the like may be improved.

FIG. 6 and FIGS. 7A and 7B show an example case in which left circularly polarized light amplified through resonance in a cavity formed by the GPL mirror (the metal reflective layer) and the output mirror (the transflective second electrode) is output through the output mirror. However, this is merely an example, and embodiments are not limited thereto. As another example, in a light emitting device according to an embodiment, right circularly polarized light amplified through resonance in the cavity formed by the GPL mirror (the metal reflective layer) and the output mirror (the transflective second electrode) may be output through the output mirror.

On the other hand, in the above, a case in which the light emitting device according to an embodiment has a plurality of protrusions forming an oblong phase modulation element on a phase modulation surface of a reflective mirror layer has been described and illustrated. As another example, the light emitting device may include both a plurality of protrusions and a plurality of recesses on the phase modulation surface of the reflective mirror layer.

Figure 8:
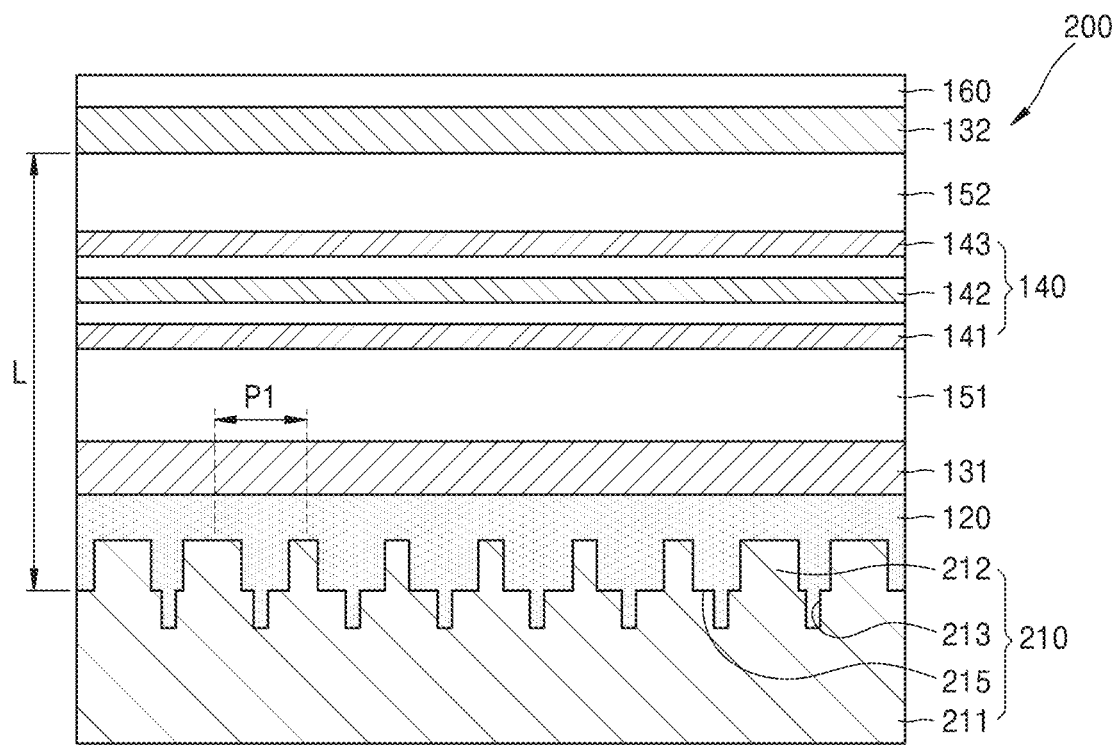
FIG. 8 is a cross-sectional view of a light emitting device according to an embodiment.
Figure 9:
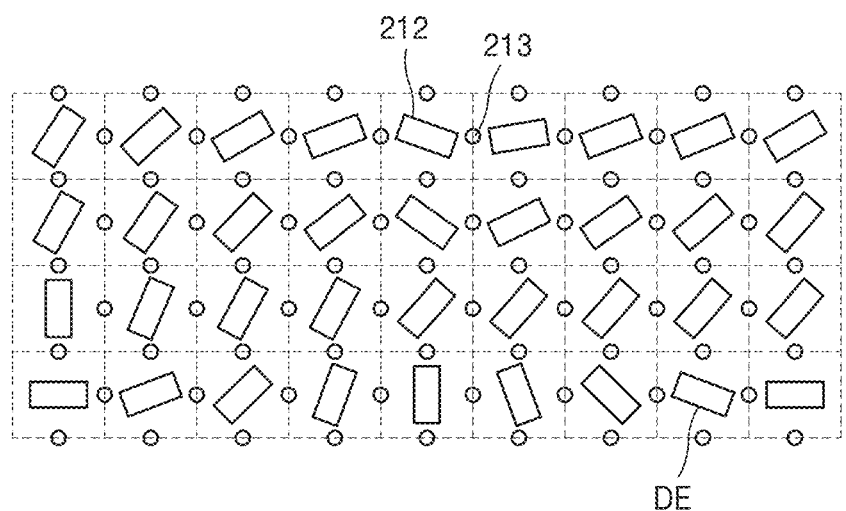
FIG. 9 is a plan view of the metal reflective layer of FIG. 7, illustrating a partial area of the metal reflective layer according to an embodiment.

FIG. 8 schematically shows a cross-sectional view of a light emitting device 200 according to an embodiment. FIG. 9 is a plan view of the metal reflective layer 210 of FIG. 8, illustrating a partial area of the metal reflective layer 210. The light emitting device 200 of FIG. 8 is different from the light emitting device 100 of FIG. 1 in that a plurality of recesses 213 are further provided on a phase modulation surface 215 of a metal reflective layer 210.

Referring to FIGS. 8 and 9, the metal reflective layer 210 may include a base portion 211 and a phase modulation surface 215 formed on an upper surface of the base portion 211, and a plurality of protrusions 212 and a plurality of recesses 213 may be formed on the phase modulation surface 215.

The base portion 211 and the plurality of protrusions 212 may correspond to the base portion 111 and the plurality of protrusions 112 of FIG. 1, respectively. Like the plurality of protrusions 112 of FIG. 1, the plurality of protrusions 212 constitute oblong phase modulation elements, and are arranged at various angles with respect to a horizontal or vertical direction on a plane of the phase modulation surface 215, such as an arrangement of oblong phase modulation elements forming a GPL described with reference to FIGS. 2 and 3. The intervals P1 between the protrusions 212 may be constant. Repeated descriptions of the base portion 211 and the plurality of protrusions 212 are omitted.

Meanwhile, the plurality of recesses 213 may be formed in an area between the plurality of protrusions 212 as shown, for example, in FIG. 9 (i.e., between adjacent protrusions). The plurality of protrusions 212 may be formed to have a certain height to protrude from the upper surface of the base portion 211 of the metal reflective layer 210 and may have dimensions less than a wavelength of incident light. The plurality of recesses 213 may be formed to have a certain depth to be recessed from the upper surface of the base portion 211 of the metal reflective layer 210 and may have dimensions less than the wavelength of the incident light.

As shown, for example, in FIG. 9, the plurality of recesses 213 may be formed to be apart from the protrusions 212 in an area between the plurality of protrusions 212, and an area occupied by the upper surface of the base portion 211 may be greater than an area occupied by the plurality of protrusions 212 or the plurality of recesses 213. In addition, an area occupied by each of the protrusions 212 may be greater than or equal to an area occupied by each of the recesses 213.

Optical characteristics (e.g., a phase delay of reflected light) of a phase modulation surface 215 that contribute to a resonance wavelength may be determined by the size of the protrusions 212, the ratio of the width in the long-axis direction and the width in the short-axis direction of the protrusions 212 and the height of each of the plurality of protrusions 212, and the interval P1 of the protrusions 212. Therefore, when the resonance wavelength of the micro-cavity L is $\lambda$, the size, the ratio of a width in a long-axis direction and a width in a short-axis direction, and the height of each of the protrusions 212 of the phase modulation surface 215 and the interval P1 of the protrusions 112 may be selected such that an optical length of the micro-cavity L satisfies $n\lambda/2$ (n is a natural number). The light-emitting device 200 illustrated in FIG. 8 may be, for example, a red light-emitting device in which the micro-cavity L is adjusted to have a wavelength (i.e., a range of wavelengths) of red light as the resonance wavelength. In addition, the light-emitting device 200 illustrated in FIG. 8 may be a green light-emitting device in which the micro-cavity L is adjusted to have a wavelength (i.e., a range of wavelengths) of green light as a resonance wavelength.

Meanwhile, as in FIGS. 8 and 9, when the plurality of protrusions 212 and the plurality of recesses 213 are provided on the phase modulation surface 215 of the metal reflective layer 210, the plurality of protrusions 212 may resonate light of a first wavelength (e.g., red light or green light) desired for resonance, and the plurality of recesses 213 may absorb light of a second wavelength (e.g., blue light) not desired for resonance (i.e., a range of wavelengths).

Each of the plurality of protrusions 212 may have, for example, a width of about 300 nm or less in at least one of a width in a long-axis direction and a width in a short-axis direction. However, the disclosure is not limited thereto. For example, each of the plurality of protrusions 212 may have at least one of a width in the long-axis direction and a width in the short-axis direction of about 30 nm to about 250 nm. In addition, each of the plurality of protrusions 212, for example, may have a height of about 100 nm or less. However, this is merely an example.

Each of the plurality of recesses 213 may have, for example, a diameter of about 250 nm or less. For a specific example, each of the plurality of recesses 213 may have a diameter of about 80 nm to about 250 nm, but is not limited thereto. In addition, each of the plurality of recesses 213 may have, for example, a depth of about 100 nm or less. However, this is merely an example. In addition, a difference between at least one of the width in the long-axis direction and the width in the short-axis direction of the protrusion 212 and a diameter of the recess 213 may be, for example, about 100 nm or less, but is not limited thereto.

Figure 10A:
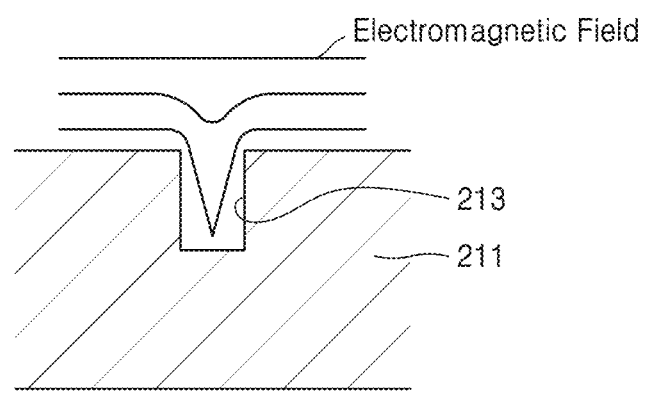
FIG. 10A is a view illustrating a state in which light of a short wavelength flows into a recess formed on a surface of a base portion of a metal reflective layer according to an embodiment.

FIG. 10A shows a state in which light of a short wavelength flows into the recess 213 formed on a surface of the base portion 211 of the metal reflective layer 210. In addition, FIG. 10B shows a state in which light of a long wavelength is blocked from entering the recess 213 formed on the surface of the base portion 211 of the metal reflective layer 210.

Figure 10B:
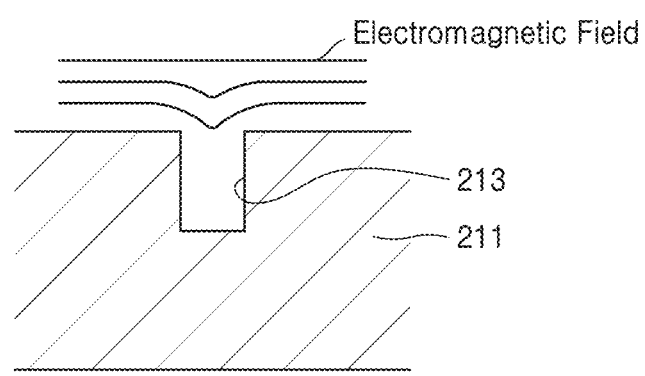
FIG. 10B is a view illustrating a state in which light of a long wavelength is blocked from flowing into a recess formed on a surface of a base portion of a metal reflective layer according to an embodiment.

As shown in FIG. 10A, the light of a short wavelength is introduced and absorbed into the nano-sized recess 213 formed on the surface of the metal reflective layer 210, whereas, as shown in FIG. 10B, the light of a long wavelength does not travel into the recess 213 and is instead reflected by the surface of the metal reflective layer 210.

A wavelength of light absorbed into the recess 213 formed on the surface of the metal reflective layer 210 may vary depending on the size of the recess 213. For example, a recess having a diameter of approximately 190 nm formed on the surface of a flat Ag mirror that does not include protrusions may absorb blue light having a wavelength of 450 nm, and a recess having a diameter of approximately 244 nm may absorb green light having a wavelength of 550 nm.

In a display apparatus using a light-emitting device, for example, an OLED, due to a limitation in a physical thickness of a light-emitting portion, a micro-cavity may mainly use secondary resonance of a wavelength that tends to resonate. For example, secondary resonance of a red light wavelength having a 600 nm band occurs in a micro-cavity of a red light emitting device. However, in this case, third resonance of a blue light wavelength having a 400 nm band also occurs at the same time, and thus, color purity may be degraded.

For example, the light emitting device 200 according to an embodiment may have the micro-cavity L for resonating red light R, and the recess 213 may be formed to have a size into which blue light B is introduced and absorbed. For example, each of the plurality of recesses 113 may have a diameter of about 250 nm or less. In this case, the red light R does not travel into the inside of the recess 213 formed on the surface of the metal reflective layer 210 and may instead be reflected by the surface of the metal reflective layer 210, and the blue light B having a shorter wavelength than the red light R may be absorbed by traveling into the recess 213 formed on the surface of the metal reflective layer 210. Accordingly, in the micro-cavity L, only the red light R may be resonated and emitted to the outside.

In addition, the light emitting device 200 according to an embodiment may be a green light emitting device. In general, a micro-cavity having a flat surface of a metal reflective layer does not affect a display apparatus using a visible light because third resonance of a wavelength in an ultraviolet region occurs when second resonance of a green light wavelength occurs. However, in a micro-cavity in which the surface of the metal reflective layer 210 has a meta structure as in the light emitting device 200 according to an embodiment, third resonance of blue light wavelength may occur due to phase modulation. In addition, because an optical length varies according to a refractive index and thickness of the dielectric layer 120 provided to protect the surface of the metal reflective layer 210 of the meta structure, a resonance wavelength may be changed, and thus, blue light of an undesired short wavelength may be emitted even from a green light emitting device in which a green light wavelength resonates. Accordingly, even when the light emitting device 200 is a green light emitting device, color purity may be improved by suppressing undesired blue light emission by forming the plurality of recesses 213 on the surface of the metal reflective layer 210.

Like the light emitting device 200 according to an embodiment, by forming a plurality of nano-sized recesses 213 along with the plurality of protrusions 212 on the phase modulation surface of the metal reflective layer 210, light of a long wavelength desired for resonance (e.g., red light or green light) is resonated and emitted, and light of a short wavelength not desired for resonance (e.g., blue light) is absorbed by the plurality of recesses 213 to improve color purity.

According to the light emitting devices 100 and 200 according to embodiments, a phase modulation surface of a metal reflective layer forming a micro-cavity includes a plurality of protrusions having a size less than a wavelength of incident light and is configured to form an arrangement forming a GPL as an oblong phase modulation element, and it is possible to easily induce resonance of a desired wavelength by adjusting the size of the protrusions, the ratio of a width in a long-axis direction and a width in a short-axis direction of the protrusions, and a pitch of the protrusions, and specific polarized light, for example, one circularly polarized light, may be output as focused light.

In addition, by forming a plurality of nano-sized recesses on the phase modulation surface of the metal reflective layer, light of a wavelength desired for resonance (e.g., red light or green light) may be resonated and emitted to the outside, and light of a wavelength not desired for resonance (e.g., blue light) may be absorbed by the plurality of recesses, thereby improving color purity.

Hereinafter, a display apparatus employing a light emitting device according to an embodiment as a pixel having a certain color will be described.

Figure 11:
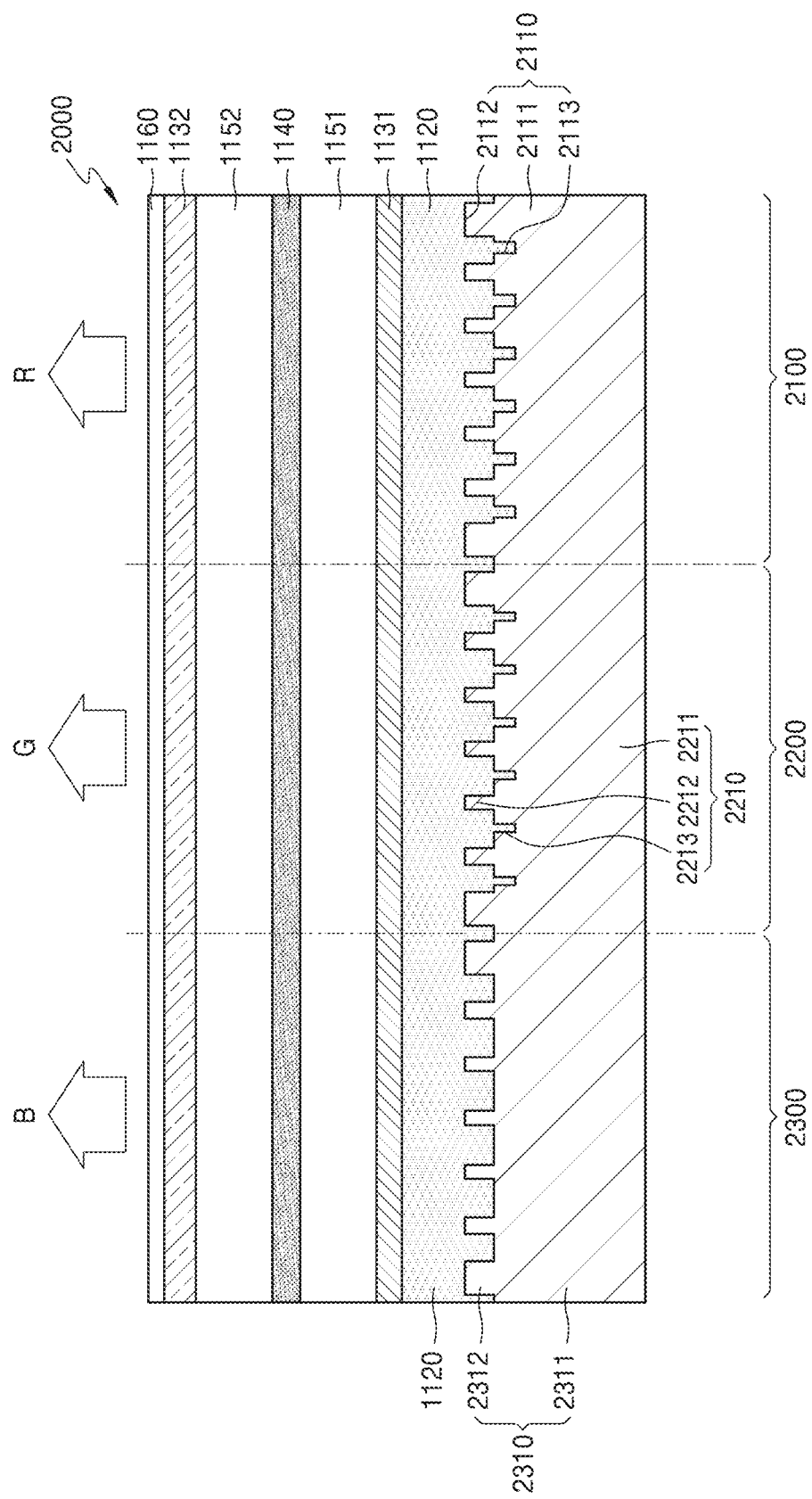
FIG. 11 is a cross-sectional view of a display apparatus according to an embodiment.

FIG. 11 is a cross-sectional view of a display apparatus 2000 according to an example embodiment.

Referring to FIG. 11, the display apparatus 2000 includes a plurality of pixels that emit light of different colors. The plurality of pixels (i.e., regions) may include red, green, and blue pixels 2100, 2200, and 2300 arranged adjacent to each other on the same plane of a substrate. For convenience, only one unit pixel composed of the red, green, and blue pixels 2100, 2200, and 2300 is shown in FIG. 11.

The red pixel 2100 may have the same structure as the light emitting device 200 shown in FIG. 8. The red pixel 2100 includes a first metal reflective layer 2110 including a first phase modulation surface, a first electrode 1131 provided on the first metal reflective layer 2110, an organic emission layer 1140 provided on the first electrode 1131, and a second electrode 1132 provided on the organic emission layer 1140. In FIG. 11, reference numerals 2111, 2112, and 2113 denote a base portion, a plurality of protrusions, and a plurality of recesses of the first metal reflective layer 2110, respectively. A dielectric layer 1120 may be provided between the first metal reflective layer 2110 and the first electrode 1131 to cover a first phase modulation surface of the first metal reflective layer 2110. Because the detailed structure and function of the red pixel 2100 has been described above, a repetitive description is omitted.

The green pixel 2200 may have the same structure as that of the light emitting device 100 shown in FIG. 1 or the light emitting device 200 shown in FIG. 8. FIG. 11 shows an example case where the green pixel 2200 has the same structure as that of the light emitting device 200 shown in FIG. 8. When the green pixel 2200 has the same structure as that of the light emitting device 200 of FIG. 8, the green pixel 2200 includes a second metal reflective layer 2210 including a second phase modulation surface, the first electrode 1131 provided on the second metal reflective layer 2210, and the organic emission layer 1140 provided on the first electrode 1131, and the second electrode 1132 provided on the organic emission layer 1140. In FIG. 11, reference numerals 2211, 2212, and 2213 denote a base portion, a plurality of protrusions, and a plurality of recesses of the second metal reflective layer 2210. The dielectric layer 1120 may be provided between the second metal reflective layer 2210 and the first electrode 1131 to cover a second phase modulation surface of the second metal reflective layer 2210. Because the detailed structure and function of the green pixel 2200 has been described above, a repetitive description is omitted.

The blue pixel 2300 may have the same structure as the light emitting device 100 shown in FIG. 1. The blue pixel 2300 includes a third metal reflective layer 2310 including a third phase modulation surface, the first electrode 1131 provided on the third metal reflective layer 2310, the organic emission layer 1140 provided on the first electrode 1131, and the second electrode 1132 provided on the organic emission layer 1140. Reference numerals 2311 and 2312 denote a base portion and a plurality of protrusions of the second metal reflective layer 2310. The dielectric layer 1120 may be provided between the third metal reflective layer 2310 and the first electrode 1131 to cover a third phase modulation surface of the second metal reflective layer 2310. Because the detailed structure and function of the blue pixel 2300 has been described above, a repetitive description is omitted.

It has been described that the red pixel 2100, the green pixel 2200, and the blue pixel 2300 have the first, second and third metal reflective layers 2110, 2210, and 2310, respectively, which is expressed for convenience, and metal reflective layers of the red pixel 2100, green pixel 2200, and blue pixel 2300 may be a common layer, that is, the base portions 2111, 2211, and 2311 may be the same, and the sizes, the ratios of a width in a long-axis direction and a width in a short-axis direction, and the heights of the plurality of protrusions 2112, 2212, and 2312 (i.e., first, second, and third groups of protrusions) may be determined according to pixels of each color. Oblong phase modulation elements by the plurality of protrusions 2112, 2212, and 2312 may be arranged to form a GPL over the entire pixel.

On the other hand, the heights of upper surfaces of the plurality of protrusions 2112, 2212, and 2312 on the first phase modulation surface, the second phase modulation surface, and the third phase modulation surface may be formed equally. However, the disclosure is not limited thereto. Each of the plurality of protrusions 2112, 2212, and 2312 may have a dimension less than a wavelength of incident light.

The first, second, and third metal reflective layers 2110, 2210, and 2310 may include, for example, at least one metal material from among Ag, Al, and Au, but are not limited thereto. In addition, the dielectric layer 1120 provided to cover the first, second, and third metal reflective layers 2110, 2210, and 2310 may include an insulating material that is transparent to visible light.

The first electrode 1131 may be a transparent electrode that transmits light, and the second electrode 1132 may be a transflective electrode that reflects a portion of light and transmits a portion of the light. A passivation layer 1160 may be provided on the second electrode 1132. In addition, the organic emission layer 1140 has a structure in which a red organic emission layer, a green organic emission layer, and a blue organic emission layer are sequentially stacked between the first electrode 1131 and the second electrode 1132. The stacking order of the red organic emission layer, the green organic emission layer, and the blue organic emission layer may be variously changed. A hole injection layer 1151 may be provided between the first electrode 1131 and the organic emission layer 1140, and an electron injection layer 1152 may be provided between the second electrode 1132 and the organic emission layer 1140.

In the display apparatus 2000 having the above structure, in the red pixel 2100, the red light R generated from the red organic emission layer of the organic emission layer 1140 may reciprocate and resonate between the first metal reflective layer 2110 and the second electrode 1132, and then may be emitted to the outside through the second electrode 1132. At this time, the blue light B generated from the blue organic emission layer of the organic emission layers 1140 is absorbed by the recesses 2113 provided on the first phase modulation surface of the first metal reflective layer 2110, and thus, the red light R with improved color purity may be emitted from the red pixel 2100.

In the green pixel 2200, green light G generated from the green organic emission layer of the organic emission layers 1140 may reciprocate and resonate between the second metal reflective layer 2210 and the second electrode 1132, and then may be emitted to the outside through the second electrode 1132. When recesses 2213 are formed on the second phase modulation surface of the second metal reflective layer 2210, the blue light B is absorbed by the recesses 2213 provided on the second phase modulation surface, and thus, the green light G with improved color purity may be emitted from the green pixel 2200.

In the blue pixel 2300, the blue light B generated from the blue organic emission layer of the organic emission layers 1140 may reciprocate and resonate between the third metal reflective layer 2310 and the second electrode 1132, and then may be emitted to the outside through the second electrode 1132.

At this time, by configuring the first to third metal reflective layers 2110, 2210, and 2310 as a GPL mirror by an arrangement of the plurality of protrusions 2112, 2212, and 2312 forming an oblong phase modulation element formed on the first to third phase modulation surfaces of the red pixel 2100, the green pixel 2200, and the blue pixel 2300, respectively, focused light having certain circular polarization, for example, left circular polarization or right circular polarization, may be emitted from the display apparatus 2000 to the outside.

In addition, in the red pixel 2100, the first phase modulation surface includes a plurality of nano-sized recesses 2113 capable of absorbing the blue light B, thereby generating the red light R with improved color purity. In addition, in the green pixel 2200, the second phase modulation surface includes the plurality of nano-sized recesses 2213 capable of absorbing the blue light B, thereby generating the green light G with improved color purity.

In addition, in the red pixel 2100, the green pixel 2200, and the blue pixel 2300, the first to third phase modulation surfaces may respectively include the plurality of protrusions 2112, 2212, and 2312 having a size less than a wavelength of incident light, and resonance of a desired wavelength may be easily induced by adjusting the size of the protrusions 2112, 2212, and 2312, the ratio of a width in a long-axis direction and a width in a short-axis direction of the protrusions 2112, 2212, and 2312, and a pitch of the protrusions 2112, 2212, and 2312.

The display apparatus 2000 according to an embodiment may be applied as a micro-display of a display apparatus for augmented reality and/or virtual reality. In this case, the display apparatus for augmented reality and/or virtual reality may be implemented as a head mounted display (HMD) or a glasses-type device.

Figure 12:
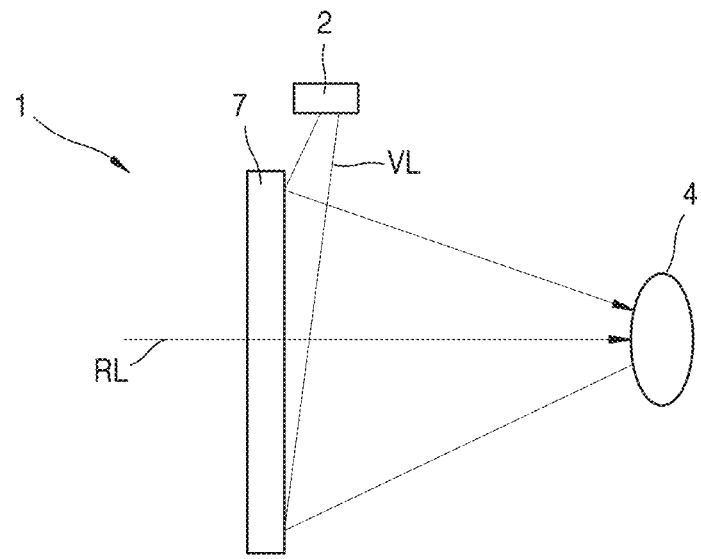
FIG. 12 is a view of a display apparatus for augmented reality in which a display apparatus according to an embodiment is applied as a micro display according to an embodiment.

FIG. 12 is a view of a display apparatus 1 for augmented reality in which the display apparatus 2000 according to an embodiment is applied as a micro display.

Referring to FIG. 12, the display apparatus 1 for augmented reality includes an image projection unit 2 and a combiner 7.

The image projection unit 2 is a unit that supplies an image or a video of virtual reality, and may be obtained by applying the display apparatus 2000 according to the embodiment described with reference to FIG. 11 as a micro display. A reflective member may be further provided between the image projection unit 2 and the combiner 7 to reflect light VL representing an image of virtual reality from the image projection unit 2 and transmit the light VL to the combiner 7.

The combiner 7 transmits the light VL representing an image of virtual reality from the image projection unit 2 to the eyes of a user 4, and allows light RL representing an image of the real world to pass through the combiner 7 and transmits the light RL to the eyes of the user 4.

When the display apparatus 1 for augmented reality is used, an image of augmented reality in which an image of the real world and an image of virtual reality supplied from the image projection unit 2 overlap can be seen in the eyes of the user 4. In addition, by controlling the combiner 7 to block the light RL representing an image of the real world, the display apparatus 1 for augmented reality may allow the user 4 to see only the image of virtual reality supplied from the image projection unit 2.

Figure 13:
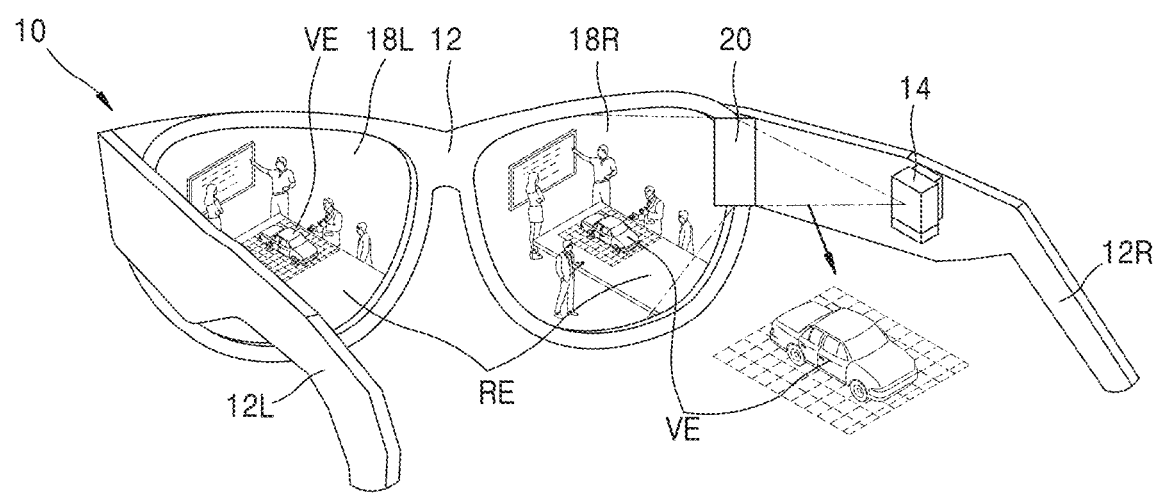
FIG. 13 is a view illustrating an example in which a display apparatus for augmented reality in which a display apparatus according to an embodiment is applied as a micro display in a glasses-type device according to an embodiment.

FIG. 13 is a view illustrating an example in which a display apparatus for augmented reality in which the display apparatus according to an embodiment is applied as a micro display is implemented as a glasses-type device.

Referring to FIG. 13, a glasses-type display apparatus 10 for augmented reality may include a first spectacle frame portion 12, first and second spectacle lenses 18L and 18R respectively mounted on the left and right sides of the first spectacle frame portion 12, an image projection unit 14, and a reflective member 20. A second spectacle frame portion 12L and a third spectacle frame portion 12R are connected to both sides of the first spectacle frame portion 12, respectively. The second and third spectacle frame portions 12L and 12R are portions that are placed on the user's left and right ears, respectively. The first spectacle frame portion 12 may have a shape similar to a rim in which the lenses of ordinary glasses are mounted, but may have a shape capable of maximally blocking the inflow of external light through areas other than the spectacle lenses 18L and 18R. For example, a fence may be provided to prevent the inflow of light to the first spectacle frame portion 12 around the spectacle lenses 18L and 18R. The first spectacle lens 18L may correspond to the user's left eye, and the second spectacle lens 18R may correspond to the user's right eye. The first and second spectacle lenses 18L and 18R are areas in which an image or video of augmented reality is displayed, and may include a combiner. The image projection unit 14 is a unit that supplies an image or a video of virtual reality, and may be obtained by applying the display apparatus 2000 according to the embodiment described with reference to FIG. 11 as a micro display. The image projection unit 14 may also be provided inside a second spectacle frame 12L corresponding to the inside of a third spectacle frame 12R. A reflective member 20 may be a mirror or a prism or may include such a member. In FIG. 12, reference numeral RE denotes an actual image that is seen through the spectacle lenses 18L and 18R, which is incident on the spectacle lenses 18L and 18R, that is, an image of the real world. In addition, reference numeral VE denotes an image of virtual reality provided from the image projection unit 14. The image displayed on the spectacle lenses 18L and 18R in FIG. 12 shows an example of an image of augmented reality in which an image of the real world and an image of virtual reality supplied from the image projection unit 14 overlap.

On the other hand, when controlling the combiner applied to the spectacle lenses 18L and 18R so that external light does not reach the inside of the spectacle lenses 18L and 18R, a display apparatus for augmented reality may be operated as a display apparatus for virtual reality because an image of the real world is not displayed inside the spectacle lenses 18L and 18R and only an image or video of virtual reality supplied from the image projection unit 84 may be displayed inside the spectacle lenses 18L and 18R.

According to a light emitting device according to an embodiment, because a phase modulation surface of a metal reflective layer forming a micro-cavity includes a plurality of protrusions having a size less than a wavelength of incident light and is configured to form an arrangement forming a GPL as an oblong phase modulation element, it is possible to easily induce resonance of a desired wavelength, and specific polarized light, for example, one circularly polarized light, may be output as focused light.

In addition, by forming a plurality of nano-sized recesses on the phase modulation surface of the metal reflective layer, light of a wavelength desired for resonance may be resonated and emitted to the outside, and light of a wavelength not desired for resonance may be absorbed by the plurality of recesses, thereby improving color purity.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light emitting device comprising:
   a metal reflective layer comprising a phase modulation surface on which oblong phase modulation elements are formed;
   a first electrode provided on the metal reflective layer;
   an organic emission layer provided on the first electrode, the organic emission layer emitting light; and
   a second electrode provided on the organic emission layer,
   wherein the oblong phase modulation elements are arranged to form a geometric phase lens, and
   wherein light having a predetermined polarization is reflected, focused, and output by the arrangement of the oblong phase modulation elements.

2. The light emitting device of claim 1, wherein a direction of a largest width of each oblong phase modulation element of the oblong phase modulation elements parallel to the phase modulation surface is different from the direction of the largest width of at least one immediately adjacent oblong phase modulation element of the oblong phase modulation elements parallel to the phase modulation surface.

3. The light emitting device of claim 1, wherein a direction of a largest width of each oblong phase modulation element of the oblong phase modulation elements parallel to the phase modulation surface is different from the direction of the largest width of at least one other oblong phase modulation element of the oblong phase modulation elements parallel to the phase modulation surface.

4. The light emitting device of claim 1, wherein the light has one of a left circular polarization and a right circular polarization.

5. The light emitting device of claim 1, wherein the organic emission layer emits white light.

6. A light emitting device comprising:
a metal reflective layer comprising a phase modulation surface on which oblong phase modulation elements are formed;
a first electrode provided on the metal reflective layer;
an organic emission layer provided on the first electrode, the organic emission layer emitting light; and
a second electrode provided on the organic emission layer,
wherein the oblong phase modulation elements are arranged to form a geometric phase lens, and
wherein the phase modulation surface of the metal reflective layer comprises a plurality of protrusions constituting the oblong phase modulation elements.

7. The light emitting device of claim 6, wherein each of the plurality of protrusions resonates blue light.

8. The light emitting device of claim 6, wherein the phase modulation surface of the metal reflective layer further comprises a plurality of recesses.

9. The light emitting device of claim 8, wherein each of the plurality of protrusions resonates light of a first wavelength, and
wherein the plurality of recesses absorbs light of a second wavelength different from the first wavelength.

10. The light emitting device of claim 9, wherein the light of the first wavelength comprises red light or green light.

11. The light emitting device of claim 10, wherein the light of the second wavelength comprises blue light.

12. A display apparatus comprising:
a plurality of pixels comprising a first pixel emitting light of a first color and a second pixel emitting light of a second color;
a metal reflective layer comprising a phase modulation surface on which oblong phase modulation elements are formed;
a first electrode provided on the metal reflective layer;
an organic emission layer provided on the first electrode, the organic emission layer emitting white light; and
a second electrode provided on the organic emission layer,
wherein the oblong phase modulation elements are arranged to form a geometric phase lens, and
wherein light having a predetermined polarization is reflected, focused, and output by the arrangement of the oblong phase modulation elements.

13. The display apparatus of claim 12, wherein the light has one of a left circular and a right circular polarization.

14. A display apparatus comprising:
a plurality of pixels comprising a first pixel emitting light of a first color and a second pixel emitting light of a second color;
a metal reflective layer comprising a phase modulation surface on which oblong phase modulation elements are formed;
a first electrode provided on the metal reflective layer;
an organic emission layer provided on the first electrode, the organic emission layer emitting white light; and
a second electrode provided on the organic emission layer,
wherein the oblong phase modulation elements are arranged to form a geometric phase lens, and
wherein the phase modulation surface of the metal reflective layer comprises a plurality of protrusions constituting the oblong phase modulation elements.

15. The display apparatus of claim 14, wherein each of the plurality of protrusions resonates blue light.

16. The display apparatus of claim 14, wherein the phase modulation surface of the metal reflective layer further comprises a plurality of recesses.

17. The display apparatus of claim 16, wherein the plurality of pixels comprises blue pixels, green pixels, and red pixels,
wherein a first area corresponding to the red pixels of the metal reflective layer comprises a first portion of the plurality of protrusions,
wherein a second area corresponding to the green pixels of the metal reflective layer comprises a second portion of the plurality of protrusions, and
wherein a third area of the metal reflective layer corresponding to the blue pixels of the metal reflective layer comprises the plurality of recesses.

18. The display apparatus of claim 16, wherein each of the plurality of protrusions resonates light of a first wavelength, and
wherein the plurality of recesses absorbs light of a second wavelength different from the first wavelength.

19. The display apparatus of claim 18, wherein the light of the first wavelength comprises red light or green light.

20. The display apparatus of claim 19, wherein the light of the second wavelength comprises blue light.

* * * * *